(12) United States Patent
Yamada et al.

(10) Patent No.: US 10,665,710 B2
(45) Date of Patent: May 26, 2020

(54) COMPOUND SEMICONDUCTOR DEVICE AND FABRICATION METHOD

(71) Applicant: FUJITSU LIMITED, Kawasaki-shi, Kanagawa (JP)

(72) Inventors: Atsushi Yamada, Hiratsuka (JP); Junji Kotani, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 10 days.

(21) Appl. No.: 16/238,094

(22) Filed: Jan. 2, 2019

(65) Prior Publication Data

US 2019/0214494 A1    Jul. 11, 2019

(30) Foreign Application Priority Data

Jan. 11, 2018    (JP) .................................. 2018-002897

(51) Int. Cl.
*H01L 29/15*    (2006.01)
*H01L 31/0256*    (2006.01)
(Continued)

(52) U.S. Cl.
CPC ...... *H01L 29/7787* (2013.01); *H01L 21/0217* (2013.01); *H01L 21/0254* (2013.01); *H01L 21/0262* (2013.01); *H01L 21/02274* (2013.01); *H01L 21/02378* (2013.01); *H01L 21/02458* (2013.01); *H01L 21/02505* (2013.01); *H01L 21/28575* (2013.01); *H01L 21/31116* (2013.01); *H01L 21/56* (2013.01); *H01L 21/7605* (2013.01); *H01L 23/3114* (2013.01); *H01L 23/3171* (2013.01); *H01L 23/4952* (2013.01); *H01L 23/49513* (2013.01); *H01L 29/1029* (2013.01); *H01L 29/2003* (2013.01); *H01L 29/205* (2013.01); *H01L 29/452* (2013.01); *H01L 29/66462* (2013.01); *H01L 21/76224* (2013.01); *H01L 23/49562* (2013.01);
(Continued)

(58) Field of Classification Search
USPC .......................... 257/76, 20, 192, 194, 285, 257/E29.246–E29.253, 197, E21.403, 257/E21.407, E21.395, E21.399; 438/167, 172
See application file for complete search history.

(56) References Cited

U.S. PATENT DOCUMENTS

2010/0289029 A1    11/2010    Ichimura et al.
2013/0075751 A1*    3/2013    Imanishi ........... H01L 29/66462
                                                    257/76
(Continued)

FOREIGN PATENT DOCUMENTS

JP    2010-267658    11/2010
JP    WO2013125126    8/2013
(Continued)

*Primary Examiner* — Niki H Nguyen
(74) *Attorney, Agent, or Firm* — Fujitsu Patent Center

(57) ABSTRACT

A disclosed compound semiconductor device includes a channel layer configured to generate carriers;
a spacer layer of $Al_{y1}Ga_{1-y1}N$ ($0.20<y1\leq0.70$) formed on the channel layer; and a barrier layer of $In_{x2}Al_{y2}Ga_{1-x2-y2}N$ ($0\leq x2\leq0.15$ and $0.20\leq y2<0.70$) formed on the spacer layer, where y1 and y2 satisfy a relationship of y1>y2.

19 Claims, 16 Drawing Sheets

(51) Int. Cl.

| | |
|---|---|
| *H01L 29/778* | (2006.01) |
| *H01L 29/205* | (2006.01) |
| *H01L 29/10* | (2006.01) |
| *H01L 29/45* | (2006.01) |
| *H01L 21/02* | (2006.01) |
| *H01L 21/76* | (2006.01) |
| *H01L 21/311* | (2006.01) |
| *H01L 21/285* | (2006.01) |
| *H01L 29/66* | (2006.01) |
| *H01L 23/31* | (2006.01) |
| *H01L 23/495* | (2006.01) |
| *H01L 29/20* | (2006.01) |
| *H01L 21/56* | (2006.01) |
| *H02M 1/42* | (2007.01) |
| *H02M 7/5387* | (2007.01) |
| *H03F 3/19* | (2006.01) |
| *H03F 1/32* | (2006.01) |
| *H03F 3/21* | (2006.01) |
| *H02M 1/00* | (2006.01) |
| *H01L 21/762* | (2006.01) |
| *H02M 3/335* | (2006.01) |

(52) U.S. Cl.
CPC ........ *H02M 1/4208* (2013.01); *H02M 1/4225* (2013.01); *H02M 3/33576* (2013.01); *H02M 7/5387* (2013.01); *H02M 2001/007* (2013.01); *H03F 1/3247* (2013.01); *H03F 3/19* (2013.01); *H03F 3/21* (2013.01); *H03F 2200/451* (2013.01)

(56) References Cited

U.S. PATENT DOCUMENTS

2014/0361337 A1    12/2014  Sugiyama et al.
2015/0303291 A1*  10/2015  Makiyama .......... H01L 29/2003
                                                                               257/76
2016/0359032 A1    12/2016  Kotani et al.

FOREIGN PATENT DOCUMENTS

| JP | 2016-162889 | 9/2016 |
|---|---|---|
| JP | 2016-225578 | 12/2016 |

\* cited by examiner

COMPOUND SEMICONDUCTOR DEVICE AND FABRICATION METHOD

CROSS-REFERENCE TO RELATED APPLICATIONS

This application is based upon and claims the benefit of priority of the prior Japanese Patent Application No. 2018-002897, filed on Jan. 11, 2018, the entire contents of which are incorporated herein by reference.

FIELD

The disclosures discussed herein relate to a compound semiconductor device and a fabrication method.

BACKGROUND

Application of nitride semiconductors to semiconductor devices with high withstand voltage and high power has been studied utilizing characteristics such as high saturated electron velocity and wide band gap. For semiconductor devices using nitride semiconductors, there have been many reports on field effect transistors, particularly high electron mobility transistors (HEMTs).

For example, in GaN-based HEMTs (GaN-HEMT), an InAlN-HEMT using GaN as a channel layer and InAlN as a barrier layer attracts attention. InAlN is known to lattice match with GaN in an In composition range of 17% to 18%. In this composition range, InAlN has a very high spontaneous polarization so as to implement two-dimensional electron gas (2DEG) with higher concentration than conventional AlGaN-HEMT. Therefore, InAlN/GaN-HEMT has attracted attention as a next generation high power device.

RELATED ART DOCUMENTS

Patent Documents

Patent Document 1: Japanese Laid-open Patent Publication No. 2016-225578
Patent Document 2: Japanese Laid-open Patent Publication No. 2016-162889
Patent Document 3: Japanese Laid-open Patent Publication No. 2010-267658
Patent Document 4: International Publication Pamphlet No. WO 2013/125126

SUMMARY

According to an aspect of an embodiment, a compound semiconductor device includes:
a channel layer configured to generate carriers;
a spacer layer of $Al_{y1}Ga_{1-y1}N$ ($0.20<y1\leq0.70$) formed on the channel layer; and
a barrier layer of $In_{x2}Al_{y2}Ga_{1-x2-y2}N$ ($0\leq x2\leq0.15$ and $0.20\leq y2<0.70$) formed on the spacer layer, wherein y1 and y2 satisfy a relationship of $y1>y2$.

According to another aspect of an embodiment, a method for fabricating a compound semiconductor device includes:
forming a channel layer configured to generate carriers;
forming a spacer layer of $Al_{y1}Ga_{1-y1}N$ ($0.20<y1\leq0.70$) on the channel layer; and
forming a barrier layer of $In_{x2}Al_{y2}Ga_{1-x2-y2}N$ ($0\leq x2\leq0.15$ and $0.20\leq y2<0.70$) on the spacer layer, wherein y1 and y2 satisfy a relationship of $y1>y2$.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In a compound semiconductor device using InAlN, the surface flatness of InAlN is typically poor, which leads to an increase in sheet resistance and a large internal leakage current due to a strong internal electric field.

Thus, it is desirable to provide a compound semiconductor device capable of reducing leakage current while reducing sheet resistance, and also provide a fabrication method thereof.

First Embodiment

In a first embodiment, a nitride semiconductor InAlGaN-HEMT is disclosed as a compound semiconductor device. FIGS. 1A to 1C, and FIGS. 2A and 2B are schematic cross-sectional views illustrating a method of fabricating an InAlGaN-HEMT according to the first embodiment in a sequential order of steps.

Figure 1A:
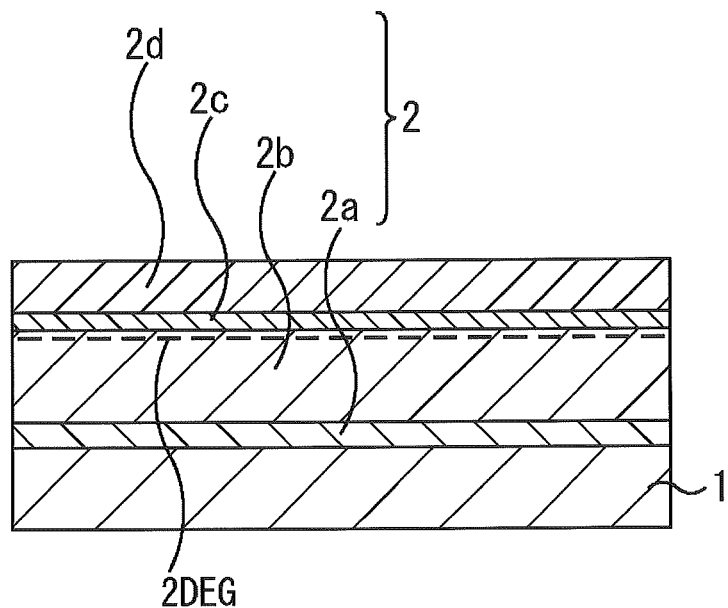
FIGS. 1A, 1B, and 1C are schematic cross-sectional views illustrating a method of fabricating an InAlGaN-HEMT according to a first embodiment in a sequential order of steps.

First, as illustrated in FIG. 1A, a compound semiconductor multilayer structure 2 is formed on a SiC substrate 1, for example, as a growth substrate. As a growth substrate, a Si substrate, a sapphire substrate, a GaAs substrate, a GaN substrate, or the like may be used instead of a SiC substrate. The conductivity of a substrate may be semi-insulating or conductive. The compound semiconductor multilayer structure 2 has a nucleation layer 2a of AlN, a channel layer 2b of GaN, a spacer layer 2c of AlGaN, and a barrier layer 2d of InAlGaN.

In the InAlGaN-HEMT, two-dimensional electron gas (2DEG) is generated as carriers in the channel layer 2b in the vicinity of an interface between the channel layer 2b and the barrier layer 2d (to be precise, the spacer layer 2c). The 2DEG is generated based on the difference in polarization between a compound semiconductor (GaN in this case) of the channel layer 2b and a compound semiconductor (InAlGaN in this case) of the barrier layer 2d.

Specifically, the following compound semiconductors are grown on the SiC substrate 1 by, for example, a metal organic vapor phase epitaxy (MOVPE) method. Instead of the MOVPE method, a molecular beam epitaxy (MBE) method, or the like may be used.

On the SiC substrate 1, AlN is grown to a thickness of approximately 100 nm, i-GaN (intentionally undoped-GaN) is grown to a thickness of approximately 3 μm, AlGaN is grown to a thickness of approximately 2 nm, and InAlGaN is grown to a thickness of approximately 8 nm, in the sequential order. Thus, the nucleation layer 2a, the channel layer 2b, the spacer layer 2c, and the barrier layer 2d are formed. Note that in order to improve the high frequency characteristic, it is necessary to shorten the distance from the gate electrode to 2DEG. However, it is also necessary to ensure a sufficient carrier concentration (2DEG concentration). In view of the above requirements, it is desirable to set a total thickness of the spacer layer 2c and the barrier layer 2d to approximately 4 nm or more and approximately 10 nm or less.

The spacer layer 2c is made of $Al_{y1}Ga_{1-y1}N$ with the Al composition set to y1, where y1 is set to $0.20 < y1 \leq 0.70$, and more preferably is set to $0.22 \leq y1 \leq 0.60$. The barrier layer 2d is made of $In_{x2}Al_{y2}Ga_{1-x2-y2}N$ with an In composition of x2 and an Al composition of y2, where x2 and y2 are set to $0 \leq x2 \leq 0.15$ and $0.20 \leq y2 < 0.70$, and more preferably are set to $0.005 \leq x2 \leq 0.15$ and $0.22 \leq y2 \leq 0.60$. y1 and y2 satisfy a relationship of y1>y2.

As a growth condition of AlN, a mixed gas of trimethylaluminum (TMAl) gas and ammonia ($NH_3$) gas is used as a source gas. As a growth condition of GaN, a mixed gas of trimethyl gallium (TMGa) gas and $NH_3$ gas is used as a source gas. As a growth condition of AlGaN, a mixed gas of TMAl gas, TMGa gas, and $NH_3$ gas is used as a source gas. As a growth condition of InAlGaN, a mixed gas of trimethylindium (TMIn) gas, TMAl gas, TMGa gas, and $NH_3$ gas is used as a source gas. Depending on a compound semiconductor layer to grow, the presence or absence of supply and flow rate of TMIn gas acting as an In source, TMAl gas acting as Al source, and TMGa gas acting as a Ga source are appropriately set to adjust In composition, Al composition, and Ga composition. The flow rate of the $NH_3$ gas used as a common source is set to approximately 100 ccm to 30 LM. Further, the growth pressure is set to approximately 1 kPa to 100 kPa, and the growth temperature is set to approximately 700° C. to 1200° C.

Subsequently, an element isolation structure (not illustrated) is formed. Specifically, for example, argon (Ar) is implanted into an element isolation region of the compound semiconductor multilayer structure 2. The element isolation structure is thus formed in surface layer portions of the compound semiconductor multilayer structure 2 and the SiC substrate 1. An active region is defined by the element isolation structure on the compound semiconductor multilayer structure 2. Note that the element isolation may be performed by, for example, an STI (Shallow Trench Isolation) method instead of the above implantation method. In this case, a chlorine-based etching gas is used for dry etching of the compound semiconductor multilayer structure 2, for example.

Figure 1B:
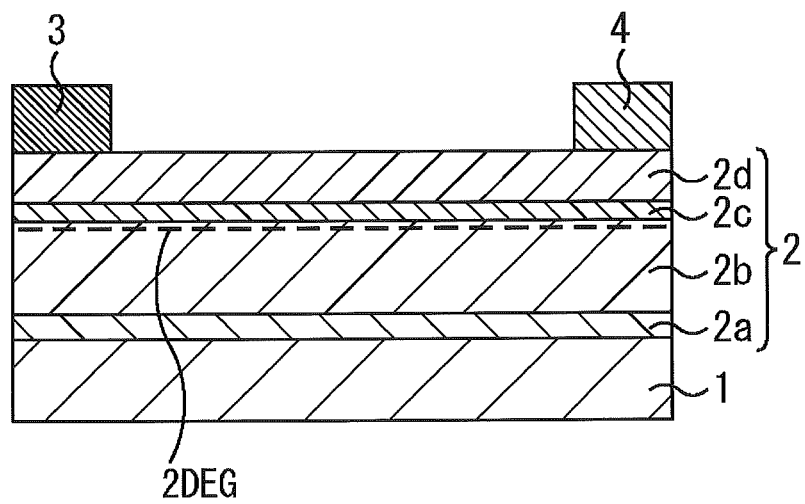

Subsequently, as illustrated in FIG. 1B, a source electrode 3 and a drain electrode 4 are formed. Specifically, first, a resist mask for forming a source electrode and a drain electrode is formed. In this example, an eaves structure double layered resist suitable for the vapor deposition method and the lift-off method is used. This resist is applied on the compound semiconductor multilayer structure 2 to form openings for exposing formation regions of the source electrode and the drain electrode. Thus, a resist mask having the openings is formed. Using this resist mask, Ta/Al is, for example, deposited as an electrode material on the resist mask including the resist mask applied to the inside of the openings by vapor deposition. The thickness of Ta is approximately 20 nm and the thickness of Al is approximately 200 nm. The resist mask and the Ta/Al deposited on the resist mask are removed by the lift-off method. Thereafter, the SiC substrate 1 is heated, for example, under a nitrogen atmosphere at a temperature range of approximately 400° C. to 1000° C., for example, at a temperature of approximately 550° C., and the remaining Ta/Al is brought into ohmic contact with the barrier layer 2d. Heat treatment may be unnecessary insofar as ohmic contact between Ta/Al and the barrier layer 2d is obtained. Thus, the source electrode 3 and the drain electrode 4 are formed on the compound semiconductor multilayer structure 2.

Figure 1C:
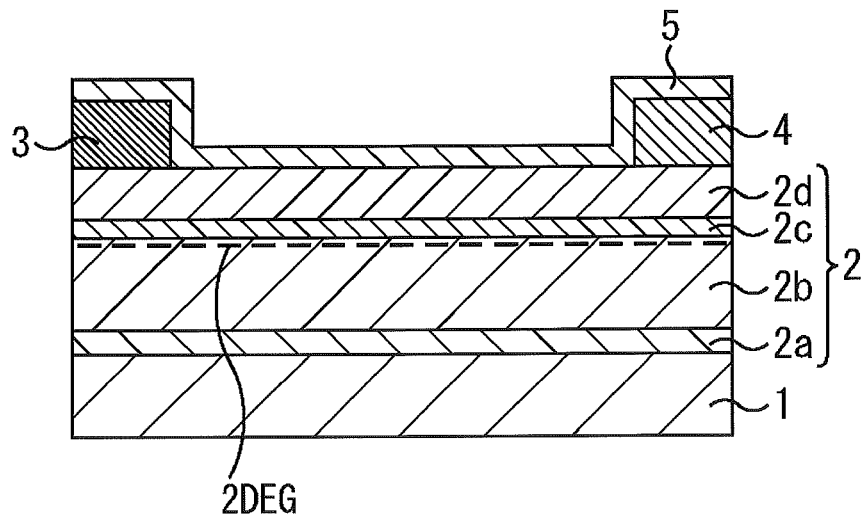

Subsequently, as illustrated in FIG. 1C, a passivation film 5 is formed. Specifically, SiN is deposited, for example, as an insulating material on the compound semiconductor multilayer structure 2 so as to cover the source electrode 3 and the drain electrode 4. SiN may be deposited in a thickness of approximately 2 nm to 500 nm, in this case, approximately 100 nm by a plasma CVD method. The passivation film 5 is thus formed. Deposition of SiN may be conducted by, for example, an ALD method or a sputtering method instead of the plasma CVD method. Instead of depositing SiN, an oxide or oxynitride of Si may be used for deposition. Besides the above, an oxide, nitride, or oxynitride of Al, Hf, Zr, Ti, Ta or W may be used for deposition, or any of these may be appropriately selected and deposited in multiple layers to form a passivation film.

Figure 2A:
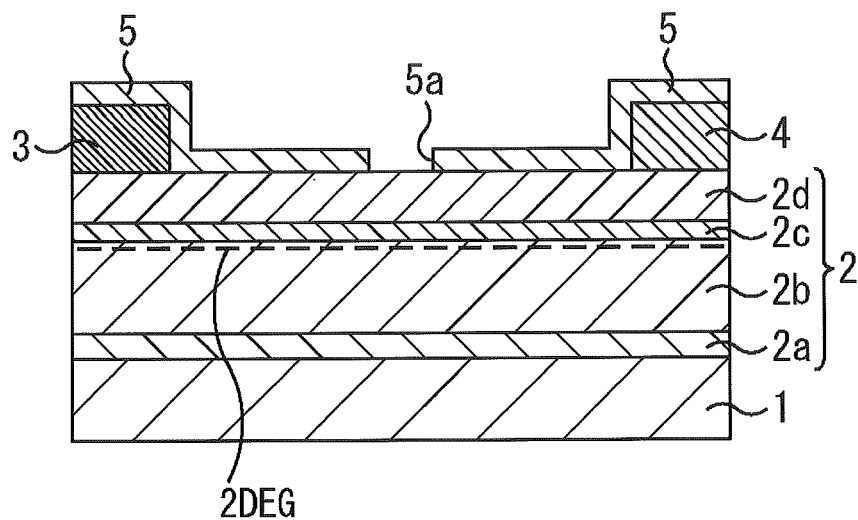
FIGS. 2A and 2B are schematic cross-sectional views illustrating the method of fabricating an InAlGaN-HEMT according to the first embodiment in a sequential order of steps subsequent to the steps in FIGS. 1A, 1B, and 1C.

Subsequently, as illustrated in FIG. 2A, an opening 5a is formed in the passivation film 5. Specifically, the passivation film 5 is patterned by lithography and dry etching. For dry etching, for example, a fluorine-based gas or a chlorine-based gas is used. Instead of dry etching, for example, wet etching using hydrofluoric acid, buffered hydrofluoric acid, or the like may be performed. As described above, the passivation film 5 is formed with an opening 5a exposing a formation region of a gate electrode on the surface of the compound semiconductor multilayer structure 2.

Figure 2B:
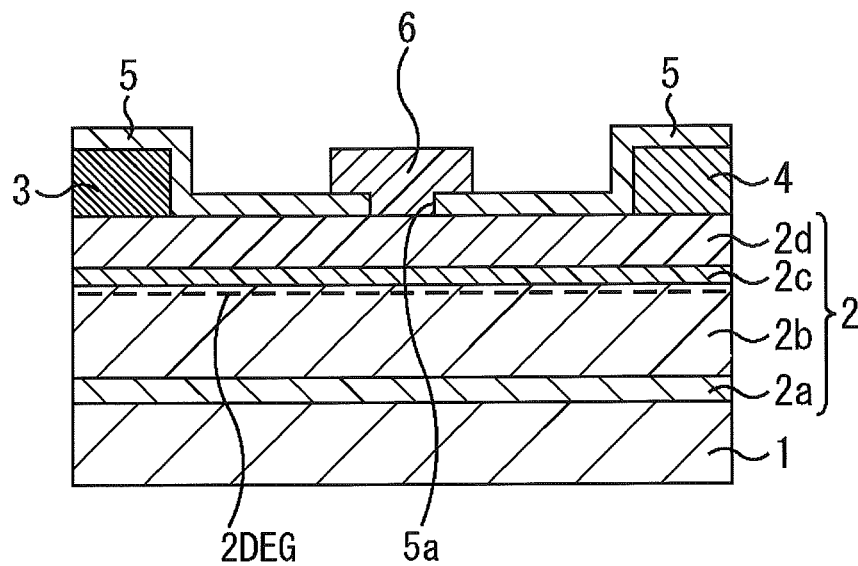

Subsequently, as illustrated in FIG. 2B, a gate electrode 6 is formed.
Specifically, first, a resist mask for forming a gate electrode is formed. In this example, an eaves structure double layered resist suitable for the vapor deposition method and the lift-off method is used. This resist is applied on the passivation film 5 to form an opening exposing a portion of the opening 5a of the passivation film 5. Thus, a resist mask having the opening is formed.

Using this resist mask, Ni/Au is deposited, for example, as an electrode material on the resist mask including the resist mask applied to the inside of the opening exposing a portion of the opening 5a of the passivation film 5, for example, by vapor deposition. The thickness of Ni is approximately 30 nm and the thickness of Au is approximately 400 nm. The resist mask and the Ni/Au deposited on the resist mask are removed by the lift-off method. As described above, the gate electrode 6 is formed on the passivation film 5 so as to embed the inside of the opening 5a with part of the electrode material.

Thereafter, an InAlGaN-HEMT according to the first embodiment is formed through various steps, such as formation of an interlayer insulating film, formation of wiring connected to the source electrode 3, the drain electrode 4 and the gate electrode 6, formation of an upper passivation film, formation of connection electrodes exposed on the outermost surface, and the like.

The following illustrates effects of the InAlGaN-HEMT according to the first embodiment.

In the first embodiment, as described above, the spacer layer 2c ($Al_{y1}Ga_{1-y1}N$) satisfies $0.20 < y1 \leq 0.70$, and more preferably satisfies $0.22 \leq y1 \leq 0.60$. The barrier layer 2d ($In_{x2}Al_{y2}Ga_{1-x2-y2}N$) satisfies $0 \leq x2 \leq 0.15$ and $0.20 \leq y2 < 0.70$, and more preferably satisfies $0.005 \leq x2 \leq 0.15$ and $0.22 \leq y2 \leq 0.60$. y1 and y2 satisfy a relationship of $y1 > y2$.

Figure 3:
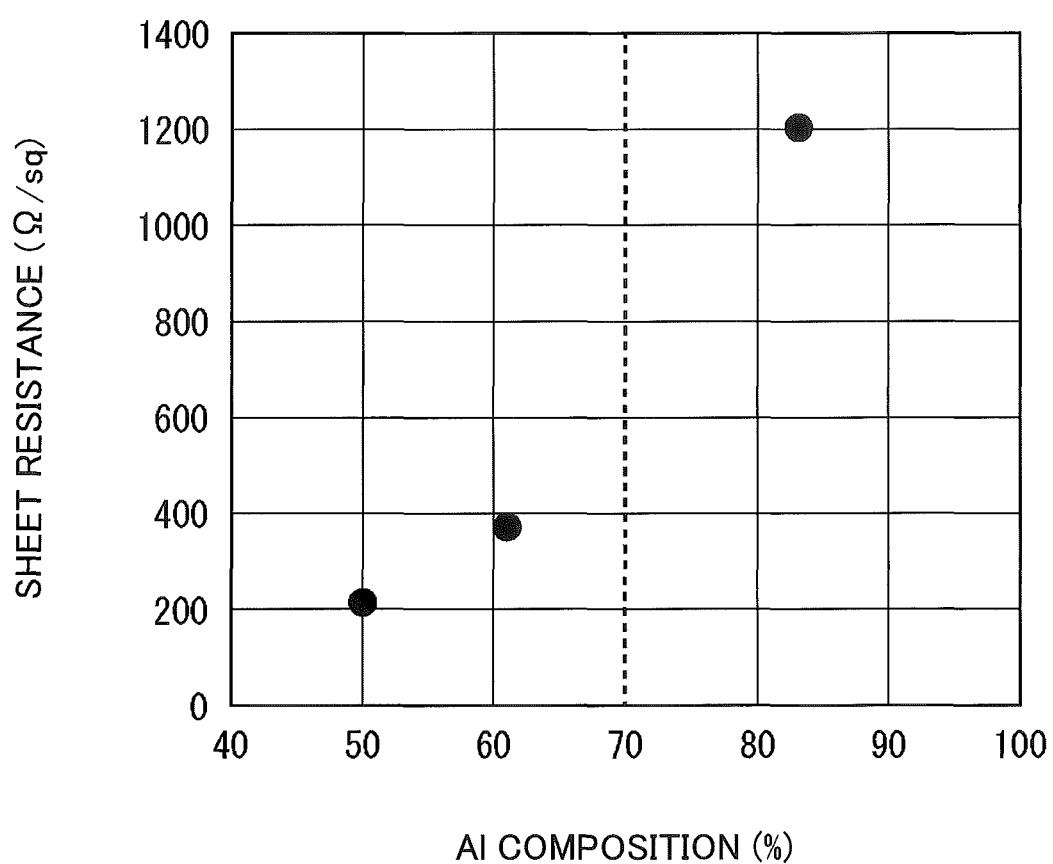
FIG. 3 is a characteristic diagram illustrating a relationship between an Al composition (%) and sheet resistance ($\Omega$/sq) with respect to an AlGaN spacer layer in an InAlGaN-HEMT.

FIG. 3 is a characteristic diagram illustrating a relationship between an Al composition (%) and sheet resistance (Ω/sq) with respect to a spacer layer of AlGaN in an InAlGaN-HEMT.
In the spacer layer of AlGaN, when the Al composition is high, sheet resistance increases due to surface roughness or the like. FIG. 3 illustrates that satisfactory reduction in sheet resistance may be obtained by setting the Al composition to 0.70 or less.

Figure 4:
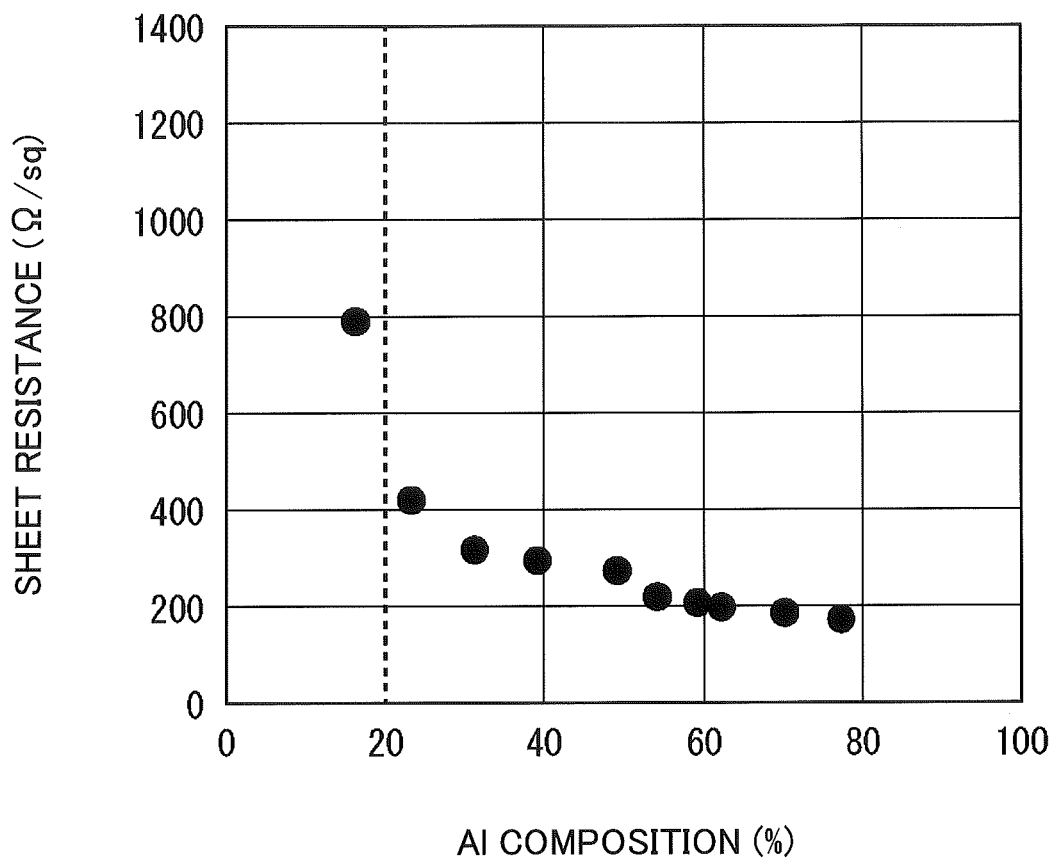
FIG. 4 is a characteristic diagram illustrating a relationship between an Al composition (%) and sheet resistance ($\Omega$/sq) with respect to an InAlGaN barrier layer in an InAlGaN-HEMT.

FIG. 4 is a characteristic diagram illustrating a relationship between an Al composition (%) and sheet resistance (Ω/sq) with respect to a barrier layer of InAlGaN in an InAlGaN-HEMT.
According to FIG. 4, in the InAlGaN barrier layer, the sheet resistance rapidly increases when the Al composition is low. FIG. 4 illustrates that satisfactory reduction in sheet resistance may be obtained by setting the Al composition to 0.20 or above.

Thus, in the InAlGaN-HEMT, the sheet resistance may be sufficiently reduced by defining the upper limit of the Al composition of the AlGaN spacer layer and the lower limit of the Al composition of the InAlGaN barrier layer. However, while the sheet resistance is improved, the gate leakage current being large becomes obvious.

Figure 5:
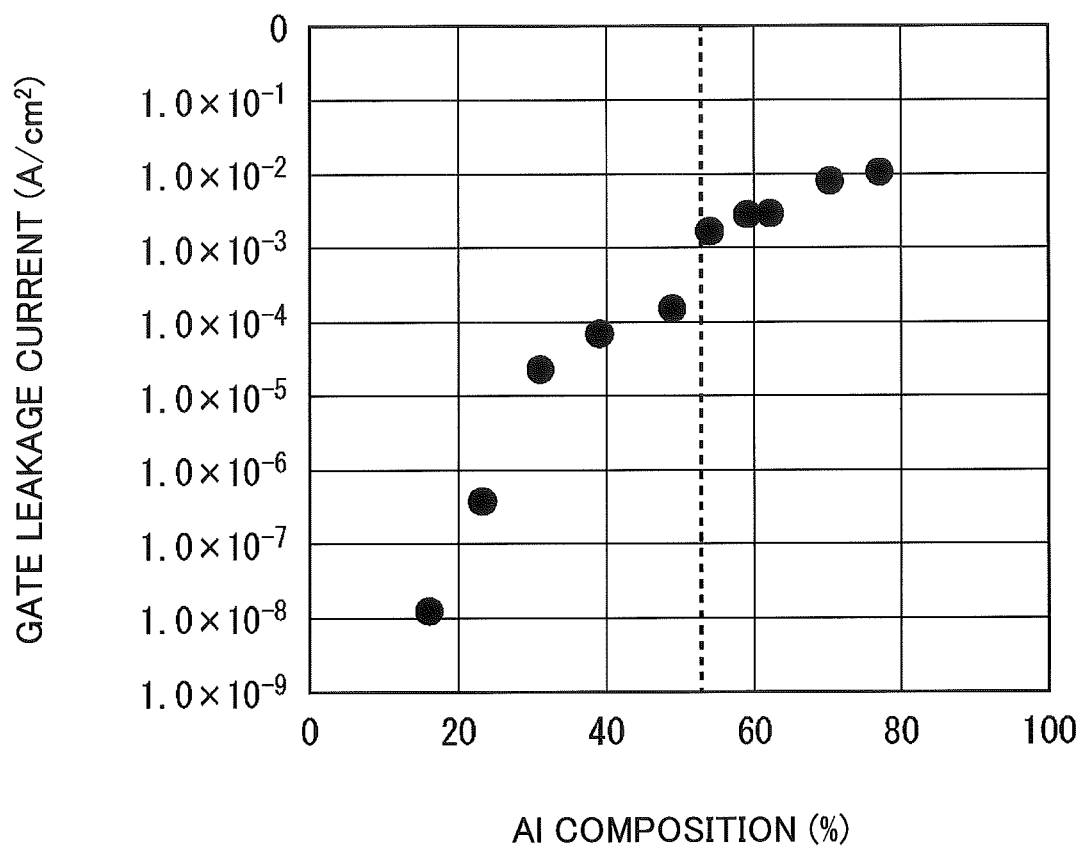
FIG. 5 is a characteristic diagram illustrating a relationship between an Al composition x (%) and a gate leakage current (A/cm$^2$) with respect to the barrier layer of $In_{0.05}Al_xGa_{0.95-x}$ in an InAlGaN-HEMT using a spacer layer of $Al_{0.55}Ga_{0.45}N$.
Figure 6:
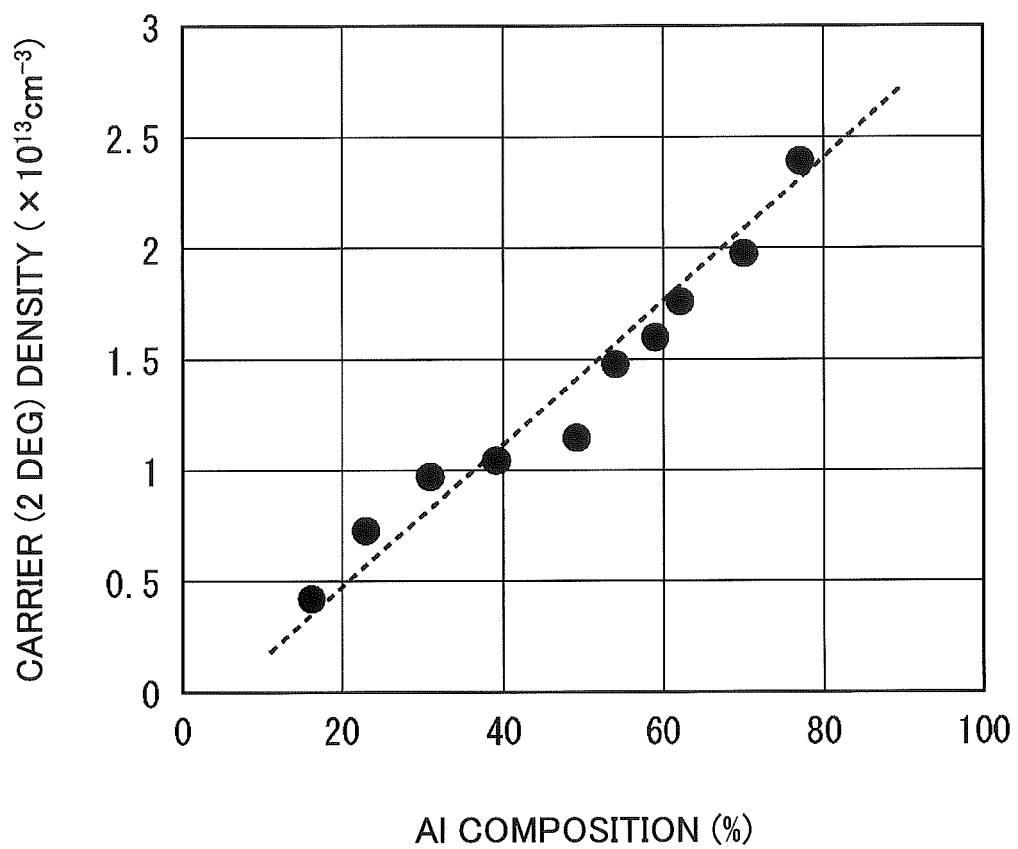
FIG. 6 is a characteristic diagram illustrating a relationship between an Al composition x (%) and a carrier (2DEG) density ($\times 10^{13}$ cm$^{-1}$) with respect to the barrier layer of $In_{0.05}Al_xGa_{0.95-x}$ in an InAlGaN-HEMT using a spacer layer of $Al_{0.55}Ga_{0.45}N$.

FIG. 5 is a characteristic diagram illustrating a relationship between an Al composition x (%) and a gate leakage current (A/cm$^2$) with respect to the barrier layer of $In_{0.05}Al_xGa_{0.95-x}$ in an InAlGaN-HEMT using a spacer layer of $Al_{0.55}Ga_{0.45}N$ with the Al composition of 0.55. FIG. 6 is a characteristic diagram illustrating a relationship between an Al composition x (%) and a carrier (2DEG) density ($\times 10^{13}$ cm$^{-1}$) with respect to the barrier layer of $In_{0.05}Al_xGa_{0.95-x}$ in an InAlGaN-HEMT using a spacer layer of $Al_{0.55}Ga_{0.45}N$.

With respect to FIG. 5, for gate leakage current decreasing as the Al composition of the barrier layer decreases, the gate leakage current significantly decreases when the Al composition of the barrier layer becomes smaller than 0.55. According to FIG. 6, it is considered that the gate leakage current decreases uniformly because the carrier concentration decreases as the Al composition of the barrier layer decreases. When the Al composition of the barrier layer becomes smaller than the Al composition of the spacer layer, a band gap of the barrier layer becomes smaller than a band gap of the spacer layer. Thus, it is considered that a band offset occurs at the interface between the spacer layer and the barrier layer such that the gate leakage current is reduced.

Figure 7:
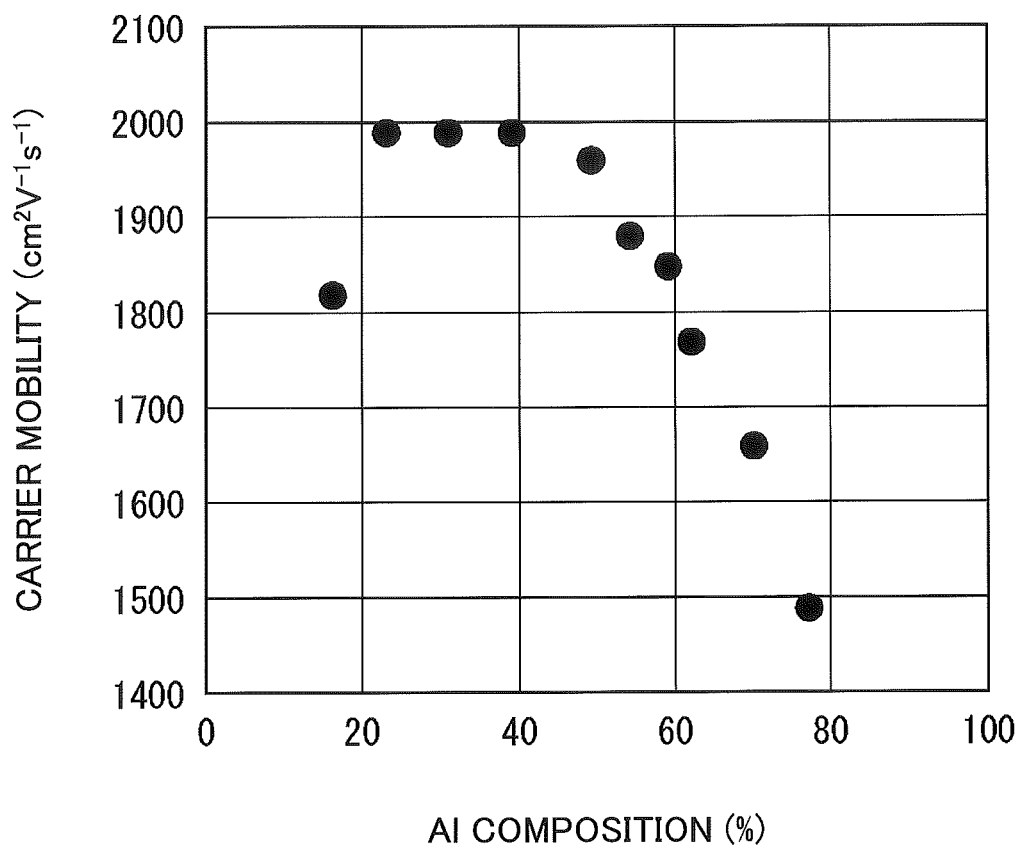
FIG. 7 is a characteristic diagram illustrating a relationship between the Al composition x (%) and mobility (cm$^2$V$^{-1}$ s$^{-1}$) with respect to the barrier layer of $In_{0.05}Al_xGa_{0.95-x}$ in InAlGaN-HEMT using a spacer layer of $Al_{0.55}Ga_{0.45}N$.

FIG. 7 is a characteristic diagram illustrating a relationship between the Al composition x (%) and mobility (cm$^2$V$^{-1}$ s$^{-1}$) with respect to the barrier layer of $In_{0.05}Al_xGa_{0.95-x}$ in an InAlGaN-HEMT using a spacer layer of $Al_{0.55}Ga_{0.45}N$. According to FIG. 4, when the Al composition of the barrier layer is 0.20 or more, the sheet resistance is reduced to 450 (Ω/sq) or less even if the carrier density decreases due to a decrease in an Al composition. It is considered that this is because although the carrier concentration decreases with a decrease in the Al composition of the barrier layer, the carrier mobility increases. According to FIG. 6, the carrier concentration becomes as low as approximately $0.50 \times 10^{13}$ cm$^{-3}$ to $1.50 \times 10^{13}$ cm$^{-3}$ in a range where the Al composition of the barrier layer is approximately 20% to 50%. In this case, as may be clear from FIG. 7, the carrier mobility is approximately 1900 (cm$^2$V$^{-1}$ s$^{-1}$) or more in the Al composition of the barrier layer being in a range of approximately 20% to 50%, indicating that extremely high carrier mobility is provided.

In the InAlGaN-HEMT, the In composition of the barrier layer of InAlGaN is preferably in a range of approximately 0(%) to 15(%) in consideration of the lattice matching with the GaN of the channel layer.

As described above, in the first embodiment, the Al composition y1 of the spacer layer 2c ($Al_{y1}Ga_{1-y1}N$), the In composition x2, and the Al composition y2 of the barrier layer 2d ($In_{x2}Al_{y2}Ga_{1-x2-y2}N$) are defined as follows:
$0.20 < y1 \leq 0.70$ $0 \leq x2 \leq 0.15$
$0.20 \leq y2 < 0.70$
$y1 > y2$ According to the definitions described above, it is possible to reduce the leakage current while reducing the sheet resistance.

Note that with respect to the Al composition y1 of the spacer layer 2c and the Al composition y2 of the barrier layer 2d, it is preferable to set y1 to $0.22 \leq y1 \leq 0.60$ and set y2 to $0.22 \leq y2 \leq 0.60$, in order to further reduce the sheet resistance as seen from FIGS. 3 and 4. With respect to the In composition x2 of the barrier layer 2d, it is preferable to set the lower limit of the In composition x2 to 0.005 ($0.005 \leq x2 \leq 0.15$) in consideration of the reduction of distortion in the barrier layer 2d.

Second Embodiment

In a second embodiment, as disclosed in the first embodiment, a nitride semiconductor InAlGaN-HEMT is disclosed as a compound semiconductor device; however, a composition of a compound semiconductor multilayer structure in the second embodiment differs from that of the compound semiconductor multilayer structure in the first embodiment. FIGS. 8A to 8C, and FIGS. 9A to 9C are schematic cross-sectional views illustrating a method of fabricating an InAlGaN-HEMT according to the second embodiment in a sequential order of steps. Note that in the second embodiment, the same components as those described in the first embodiment are denoted by the same reference numerals.

Figure 8A:
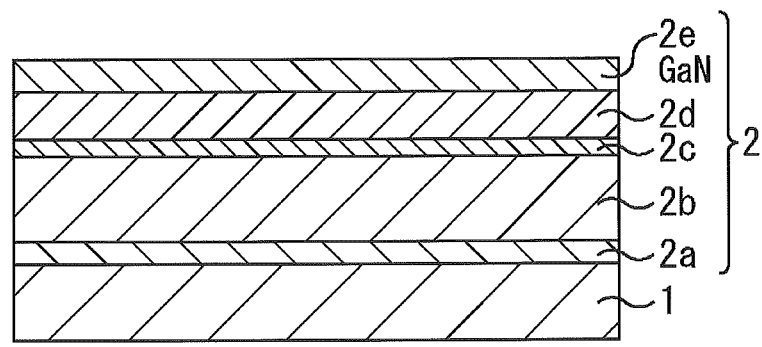
FIGS. 8A, 8B, and 8C are schematic cross-sectional views illustrating a method of fabricating an InAlGaN-HEMT according to a second embodiment in a sequential order of steps.

First, as illustrated in FIG. 8A, a compound semiconductor multilayer structure 2 is formed on a SiC substrate 1. The compound semiconductor multilayer structure 2 has a nucleation layer 2a of AlN, a channel layer 2b of GaN, a spacer layer 2c of AlGaN, a barrier layer 2d of InAlGaN, and a cap layer 2e of GaN.

On the SiC substrate 1, AlN is grown to a thickness of approximately 100 nm, i-GaN is grown to a thickness of approximately 3 μm, AlGaN is grown to a thickness of approximately 2 nm, InAlGaN is grown to a thickness of approximately 6 nm, and GaN is grown to a thickness of approximately 2 nm, in an sequential order. Thus, the nucleation layer 2a, the channel layer 2b, the spacer layer 2c, the barrier layer 2d, and the cap layer 2e are formed. Note that in order to improve the high frequency characteristic, it is necessary to shorten the distance from the gate electrode to 2DEG. However, it is also necessary to ensure a sufficient carrier concentration (2DEG concentration). In view of these requirements, it is desirable to set a total thickness of the spacer layer 2c, the barrier layer 2d, and the cap layer 2e to approximately 4 nm or more and approximately 10 nm or less.

The spacer layer 2c is made of $Al_{y1}Ga_{1-y1}N$ with the Al composition set to y1, where y1 is set to $0.20 < y1 \leq 0.70$, and more preferably is set to $0.22 \leq y1 \leq 0.60$. The barrier layer 2d is made of $In_{x2}Al_{y2}Ga_{1-x2-y2}N$ with an In composition of x2 and an Al composition of y2, where x2 and y2 are set to $0 \leq x2 \leq 0.15$ and $0.20 \leq y2 < 0.70$, and more preferably are set to $0.005 \leq x2 \leq 0.15$ and $0.22 \leq y2 \leq 0.60$. y1 and y2 satisfy a relationship of $y1 > y2$.

Figure 8B:
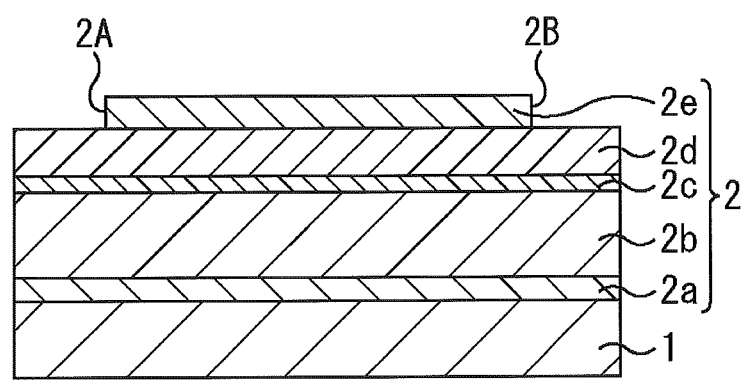

Subsequently, as illustrated in FIG. 8B, electrode recesses 2A and 2B are formed in the cap layer 2e.

Specifically, after forming the element isolation structure in the element isolation region of the compound semiconductor multilayer structure 2, the electrode recesses 2A and 2B are formed at the formation positions (electrode formation positions) of the source and drain electrodes on the surface of the compound semiconductor multilayer structure 2. A resist is applied to the surface of the compound semiconductor multilayer structure 2. The resist is processed by lithography to form openings exposing the surface of the compound semiconductor multilayer structure 2 corresponding to electrode formation positions in the resist. Thus, a resist mask having the openings is formed.

Using this resist mask, the electrode formation positions of the cap layer 2e are removed by dry etching until the surface of the barrier layer 2d is exposed. Thus, the electrode recesses 2A and 2B exposing the electrode formation positions on the surface of the barrier layer 2d are formed. As etching conditions, an inert gas such as Ar and a chlorine-based gas such as $Cl_2$ may be used as an etching gas, a flow rate of $Cl_2$ may be 30 sccm, a pressure may be 2 Pa, and an RF input power may be 20 W, for example. Note that the electrode recesses 2A and 2B may be formed by etching up to anywhere in the middle of the cap layer 2e or may be formed by etching up to the barrier layer 2d and beyond. The resist mask is removed by asking or the like.

Figure 8C:
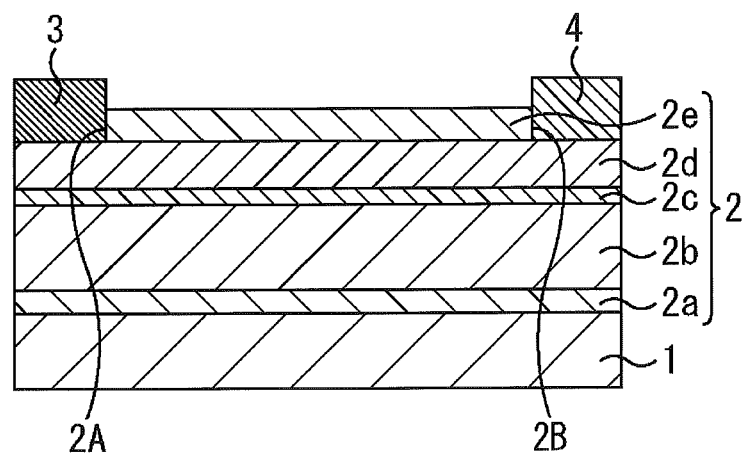

Subsequently, as illustrated in FIG. 8C, a source electrode 3 and a drain electrode 4 are formed. Specifically, first, a resist mask for forming a source electrode and a drain electrode is formed. In this example, an eaves structure double layered resist suitable for the vapor deposition method and the lift-off method is used. This resist is applied on the compound semiconductor multilayer structure 2 to form openings for exposing the electrode recesses 2A and 2B. Thus, a resist mask having the openings is formed. Using this resist mask, Ta/Al is, for example, deposited as an electrode material on the resist mask including the resist mask applied to the inside of the openings exposing the electrode recesses 2A and 2B by vapor deposition. The thickness of Ta is approximately 20 nm and the thickness of Al is approximately 200 nm. The resist mask and the Ta/Al deposited on the resist mask are removed by the lift-off method. Thereafter, the Si substrate 1 is heated, for example, under a nitrogen atmosphere at a temperature range of approximately 400° C. to 1000° C., for example, at a temperature of approximately 550° C., and the remaining Ta/Al is brought into ohmic contact with the barrier layer 2d. Heat treatment may be unnecessary insofar as ohmic contact between Ta/Al and the barrier layer 2d is obtained. As described above, the source electrode 3 and the drain electrode 4 that embed the electrode recesses 2A and 2B with part of the electrode material are formed.

Figure 9A:
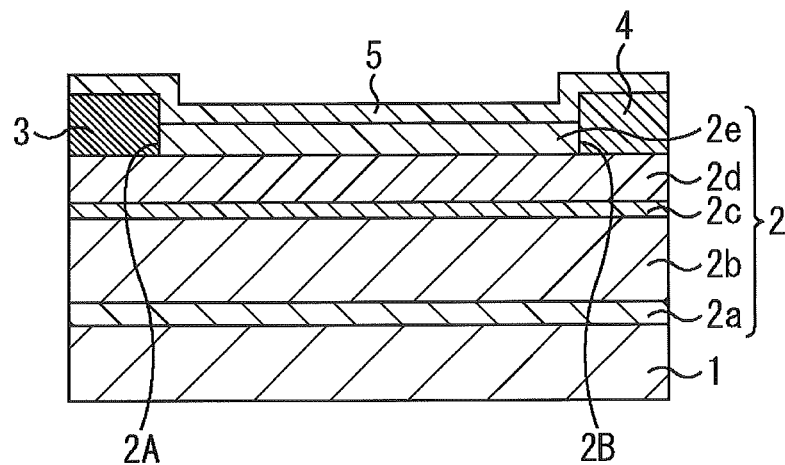
FIGS. 9A, 9B, and 9C are schematic cross-sectional views illustrating the method of fabricating an InAlGaN-HEMT according to the second embodiment in a sequential order of steps subsequent to the steps in FIGS. 8A, 8B, and 8C.

Subsequently, as illustrated in FIG. 9A, a passivation film 5 is formed. Specifically, SiN is deposited, for example, as an insulating material on the compound semiconductor multilayer structure 2 (cap layer 2e) so as to cover the source electrode 3 and the drain electrode 4. SiN may be deposited in a thickness of approximately 2 nm to 500 nm, in this case, approximately 100 nm by a plasma CVD method. The passivation film 5 is thus formed. Deposition of SiN may be conducted by, for example, an ALD method or a sputtering method instead of the plasma CVD method. Instead of depositing SiN, an oxide or oxynitride of Si may be used for deposition. Besides the above, an oxide, nitride, or oxynitride of Al, Hf, Zr, Ti, Ta or W may be used for deposition, or any of these may be appropriately selected and deposited in multiple layers to form a passivation film.

Figure 9B:
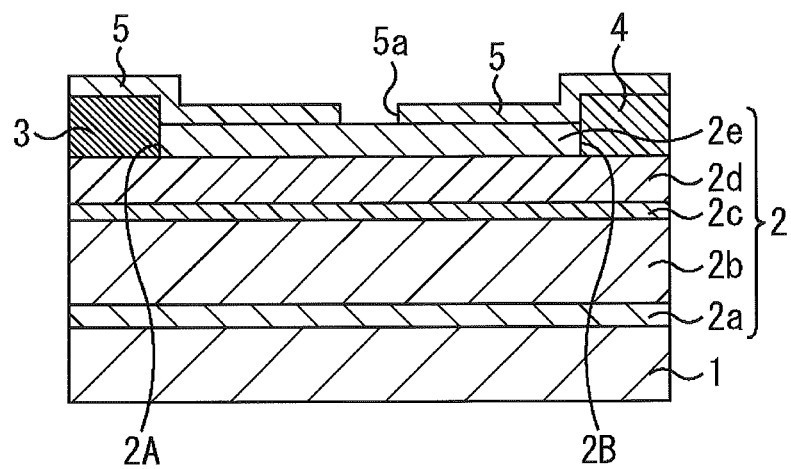

Subsequently, as illustrated in FIG. 9B, an opening 5a is formed in the passivation film 5. Specifically, the passivation film 5 is patterned by lithography and dry etching. For dry etching, for example, a fluorine-based gas or a chlorine-based gas is used. Instead of dry etching, for example, wet etching using hydrofluoric acid, buffered hydrofluoric acid, or the like may be performed. As described above, the passivation film 5 is formed with an opening 5a exposing a formation region of a gate electrode on the surface of the compound semiconductor multilayer structure 2 (cap layer 2e).

Figure 9C:
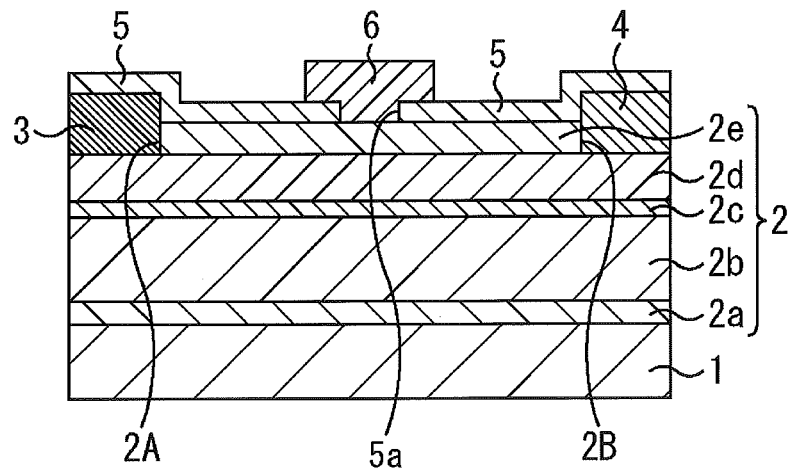

Subsequently, as illustrated in FIG. 9C, a gate electrode 6 is formed. Specifically, first, a resist mask for forming a gate electrode is formed. In this example, an eaves structure double layered resist suitable for the vapor deposition method and the lift-off method is used. This resist is applied on the passivation film 5 to form an opening exposing a portion of the opening 5a of the passivation film 5. Thus, a resist mask having the opening is formed.

Using this resist mask, Ni/Au is deposited, for example, as an electrode material on the resist mask including the resist mask applied to the inside of the opening exposing a portion of the opening 5a of the passivation film 5, for example, by vapor deposition. The thickness of Ni is approximately 30 nm and the thickness of Au is approximately 400 nm. The resist mask and the Ni/Au deposited on the resist mask are removed by the lift-off method. As described above, the gate electrode 6 is formed on the passivation film 5 so as to embed the inside of the opening 5a with part of the electrode material.

Thereafter, an InAlGaN-HEMT according to the third embodiment is formed through various steps, such as formation of an interlayer insulating film, formation of wiring connected to the source electrode 3, the drain electrode 4 and the gate electrode 6, formation of an upper passivation film, formation of connection electrodes exposed on the outermost surface, and the like.

Third Embodiment

In a third embodiment, as disclosed in the first embodiment, a nitride semiconductor InAlGaN-HEMT is disclosed as a compound semiconductor device; however, a composition of a compound semiconductor multilayer structure in the third embodiment differs from that of the compound semiconductor multilayer structure in the first embodiment. FIGS. 10A to 10C, and FIGS. 11A and 11B are schematic cross-sectional views illustrating a method of fabricating an InAlGaN-HEMT according to the third embodiment in a sequential order of steps. Note that in the third embodiment, the same components as those described in the first embodiment are denoted by the same reference numerals.

Figure 10A:
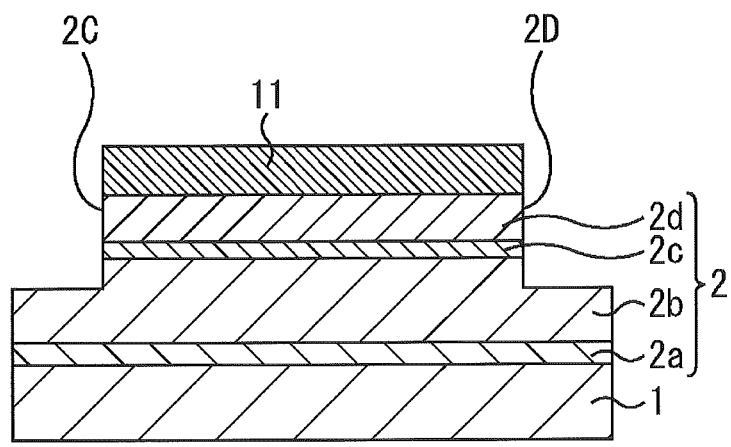
FIGS. 10A, 10B, and 10C are schematic cross-sectional views illustrating a method of fabricating an InAlGaN-HEMT according to a third embodiment in a sequential order of steps.

As illustrated in FIG. 10A, regrowth recesses 2C and 2D are formed in a compound semiconductor multilayer structure 2.
First, a compound semiconductor multilayer structure 2 is formed, in a manner similar to the first embodiment. The compound semiconductor multilayer structure 2 has a nucleation layer 2a of AlN, a channel layer 2b of GaN, a spacer layer 2c of AlGaN, and a barrier layer 2d of InAlGaN.

The spacer layer 2c is made of $Al_{y1}Ga_{1-y1}N$ with the Al composition of y1, where y1 is set to $0.20<y1\leq0.70$, and more preferably is set to $0.22\leq y1\leq 0.60$. The barrier layer 2d is made of $In_{x2}Al_{y2}Ga_{1-x2-y2}N$ with an In composition of x2 and an Al composition of y2, where x2 and y2 are set to $0\leq x2\leq 0.15$ and $0.20\leq y2<0.70$, and more preferably are set to $0.005\leq x2\leq 0.15$ and $0.22\leq y2\leq 0.60$. y1 and y2 satisfy a relationship of y1>y2.

Next, an insulating material, for example, $SiO_2$ is deposited on the compound semiconductor multilayer structure 2 by, for example, a plasma CVD method. Thus, a surface protective film 11 is formed. Deposition of $SiO_2$ may be conducted by, for example, an ALD method or a sputtering method instead of the plasma CVD method. Instead of depositing $SiO_2$, a nitride or oxynitride of Si may be used for deposition. Besides the above, an oxide, nitride, or oxynitride of Al, Hf, Zr, Ti, Ta or W may be used for deposition, or any of these may be appropriately selected and deposited in multiple layers to form a surface protective film.

Next, a resist is applied to the surface of the compound semiconductor multilayer structure 2. The resist is processed by lithography to form openings exposing the surface of the compound semiconductor multilayer structure 2 corresponding to electrode formation positions in the resist. The resist mask having the openings is thus formed. The compound semiconductor multilayer structure 2 is dry-etched using this resist mask to remove portions of the surface protective film 11, the barrier layer 2d, the spacer layer 2c, and the channel layer 2b. As an etching gas, an inert gas such as Ar and a chlorine-based gas such as $Cl_2$ are used. The regrowth recesses 2C and 2D of the compound semiconductor multilayer structure 2 are thus formed.

Figure 10B:
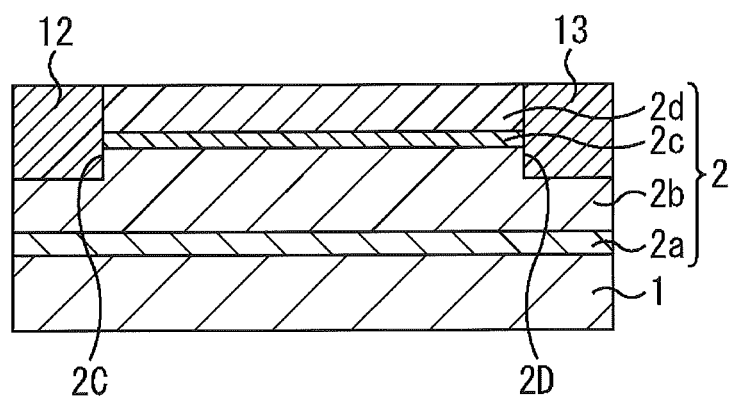

Subsequently, as illustrated in FIG. 10B, contact layers 12 and 13 are formed. Specifically, n-GaN is selectively regrown so as to embed the regrowth recesses 2C and 2D, for example, by using the MOVPE method. For example, Si is used as an n-type impurity; silane ($SiH_4$) gas containing Si is, for example, added to a source gas at a predetermined flow rate, and n-GaN is grown to a thickness of approximately 50 nm with the doping concentration of Si being, for example, approximately $1\times10^{19}$ cm$^{-3}$. Instead of Si as an n-type impurity, Ge or O may be used. The surface protective film 11 is removed by wet treatment or the like. As a result, contact layers 12 and 13 of n-GaN that embed the regrowth recesses 2C and 2D with n-GaN are formed.

Figure 10C:
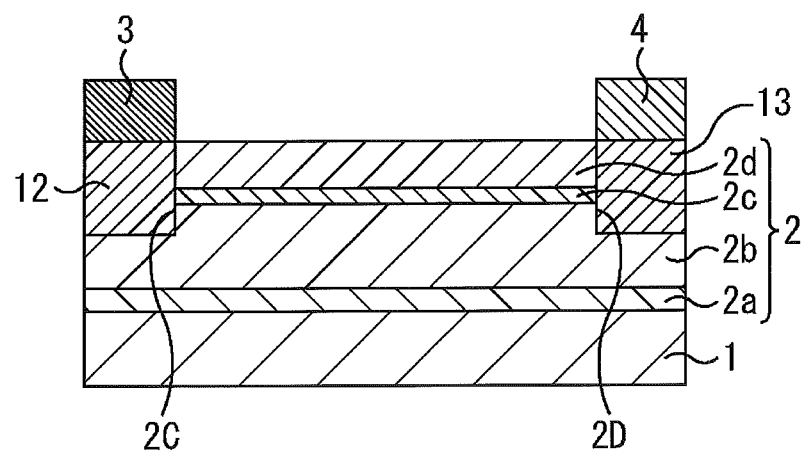

Subsequently, as illustrated in FIG. 10C, a source electrode 3 and a drain electrode 4 are formed. Specifically, after an element isolation structure is formed in the element isolation region of the compound semiconductor multilayer structure 2, a resist mask for forming a source electrode and a drain electrode is formed. In this example, an eaves structure double layered resist suitable for the vapor deposition method and the lift-off method is used. This resist is applied on the compound semiconductor multilayer structure 2 to form openings for exposing the surfaces of the contact layers 12 and 13. The resist mask having the openings is thus formed.

Using this resist mask, Ta/Al is, for example, deposited as an electrode material on the resist mask including the resist mask applied to the inside of the openings by vapor deposition. The thickness of Ta is approximately 20 nm and the thickness of Al is approximately 200 nm. The resist mask and the Ta/Al deposited on the resist mask are removed by the lift-off method. Thereafter, the SiC substrate 1 is heated, for example, under a nitrogen atmosphere at a temperature range of approximately 400° C. to 1000° C., for example, at a temperature of approximately 550° C., and the remaining Ta/Al is brought into ohmic contact with the contact layers 12 and 13. Heat treatment may be unnecessary insofar as ohmic contact between Ta/Al and the contact layers 12 and 13 is obtained. Thus, the source electrode 3 and the drain electrode 4 are formed on the contact layers 12 and 13.

Figure 11A:
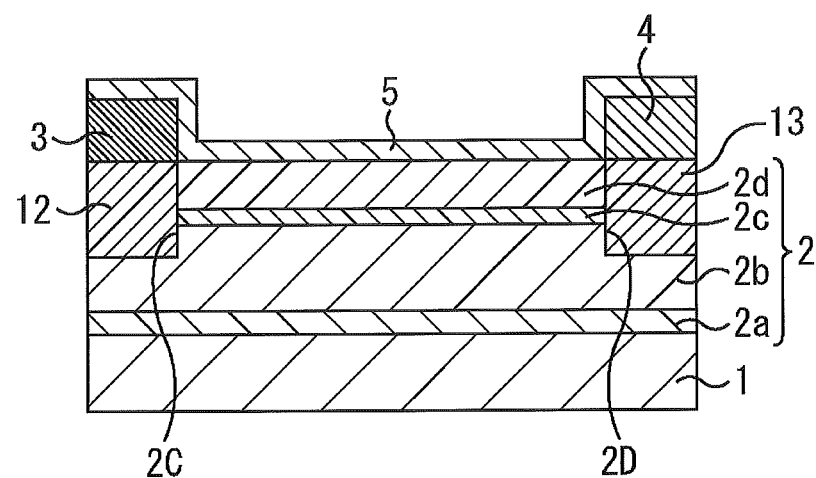
FIGS. 11A and 11B are schematic cross-sectional views illustrating the method of fabricating an InAlGaN-HEMT according to the third embodiment in a sequential order of steps subsequent to the steps in FIGS. 10A, 10B, and 10C.

Subsequently, as illustrated in FIG. 11A, a passivation film 5 is formed. Specifically, SiN is deposited, for example, as an insulating material on the compound semiconductor multilayer structure 2 so as to cover the source electrode 3 and the drain electrode 4. SiN may be deposited in a thickness of approximately 2 nm to 500 nm, in this case, approximately 100 nm by a plasma CVD method. The passivation film 5 is thus formed. Deposition of SiN may be conducted by, for example, an ALD method or a sputtering method instead of the plasma CVD method. Instead of depositing SiN, an oxide or oxynitride of Si may be used for deposition. Besides the above, an oxide, nitride, or oxynitride of Al, Hf, Zr, Ti, Ta or W may be used for deposition, or any of these may be appropriately selected and deposited in multiple layers to form a passivation film.

Figure 11B:
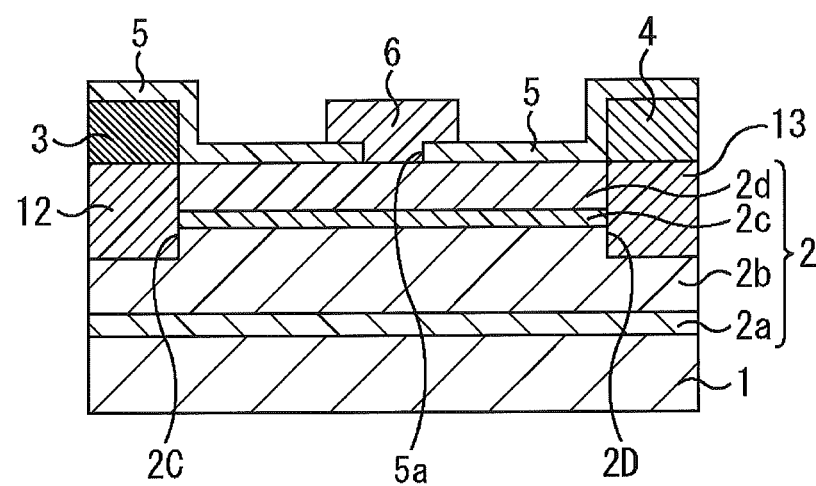

Subsequently, as illustrated in FIG. 11B, a gate electrode 6 is formed. Specifically, first, the passivation film 5 is patterned by lithography and dry etching. For dry etching, for example, a fluorine-based gas or a chlorine-based gas is used. Instead of dry etching, for example, wet etching using hydrofluoric acid, buffered hydrofluoric acid, or the like may be performed. As described above, the passivation film 5 is formed with an opening 5a exposing a formation region of a gate electrode on the surface of the compound semiconductor multilayer structure 2.

Next, a resist mask for forming a gate electrode is formed. In this example, an eaves structure double layered resist suitable for the vapor deposition method and the lift-off method is used. This resist is applied on the passivation film 5 to form an opening exposing a portion of the opening 5a of the passivation film 5. Thus, a resist mask having the opening is formed.

Using this resist mask, Ni/Au is deposited, for example, as an electrode material on the resist mask including the resist mask applied to the inside of the opening exposing a portion of the opening 5a of the passivation film 5, for example, by vapor deposition. The thickness of Ni is approximately 30 nm and the thickness of Au is approximately 400 nm. The resist mask and the Ni/Au deposited on the resist mask are removed by the lift-off method. As described above, the gate electrode 6 is formed on the passivation film 5 so as to embed the inside of the opening 5a with part of the electrode material.

Thereafter, an InAlGaN-HEMT according to the third embodiment is formed through various steps, such as formation of an interlayer insulating film, formation of wiring connected to the source electrode 3, the drain electrode 4 and the gate electrode 6, formation of an upper passivation film, formation of connection electrodes exposed on the outermost surface, and the like.

In the third embodiment, an InAlGaN-HEMT is provided with a spacer layer 2c of AlGaN and a barrier layer 2d of InAlGaN that are formed by appropriately adjusting an Al composition and an In composition, so as to reduce gate leakage current while reducing sheet resistance.

The InAlGaN-HEMT according to the first to third embodiments described above is applied to a so-called discrete package. In this discrete package, the above-described chip of InAlGaN-HEMT is mounted. Hereinafter, a discrete package of an InAlGaN-HEMT chip (hereinafter referred to as HEMT chip) according to the first to third embodiments will be exemplified.

Figure 12:
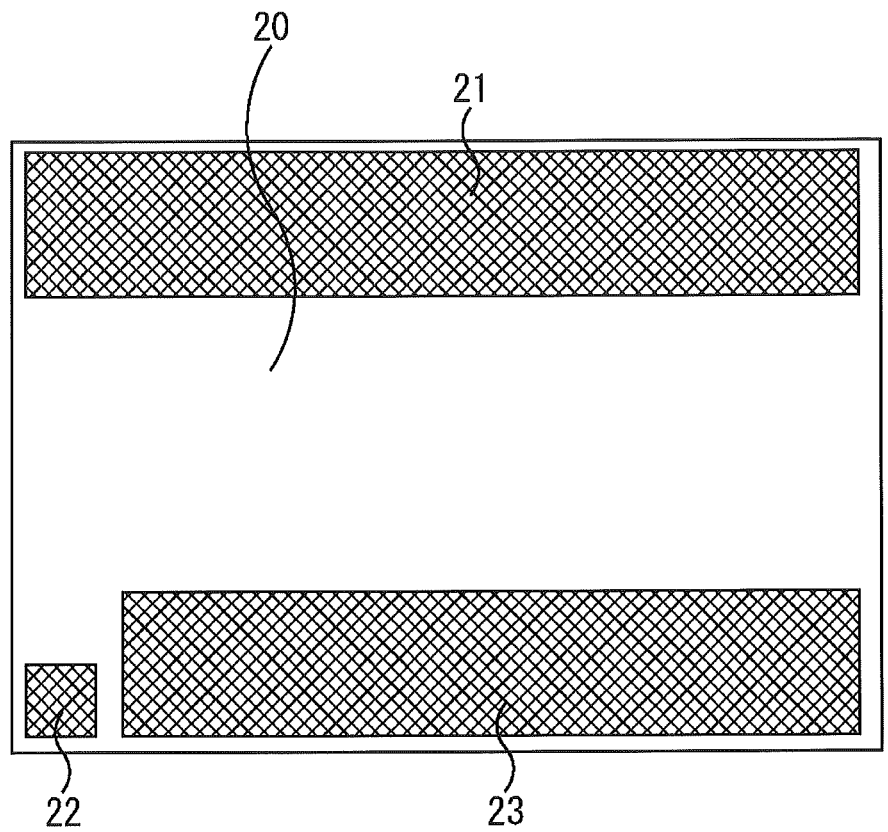
FIG. 12 is a plan view illustrating a schematic configuration of a HEMT chip.

FIG. 12 illustrates a schematic configuration of the HEMT chip. With respect to the HEMT chip 20, a drain pad 21 to which the drain electrode of the above-described InAlGaN-HEMT is connected, a gate pad 22 to which the gate electrode is connected, and a source pad 23 to which the source electrode is connected are disposed on the surface of the HEMT chip 20.

Figure 13:
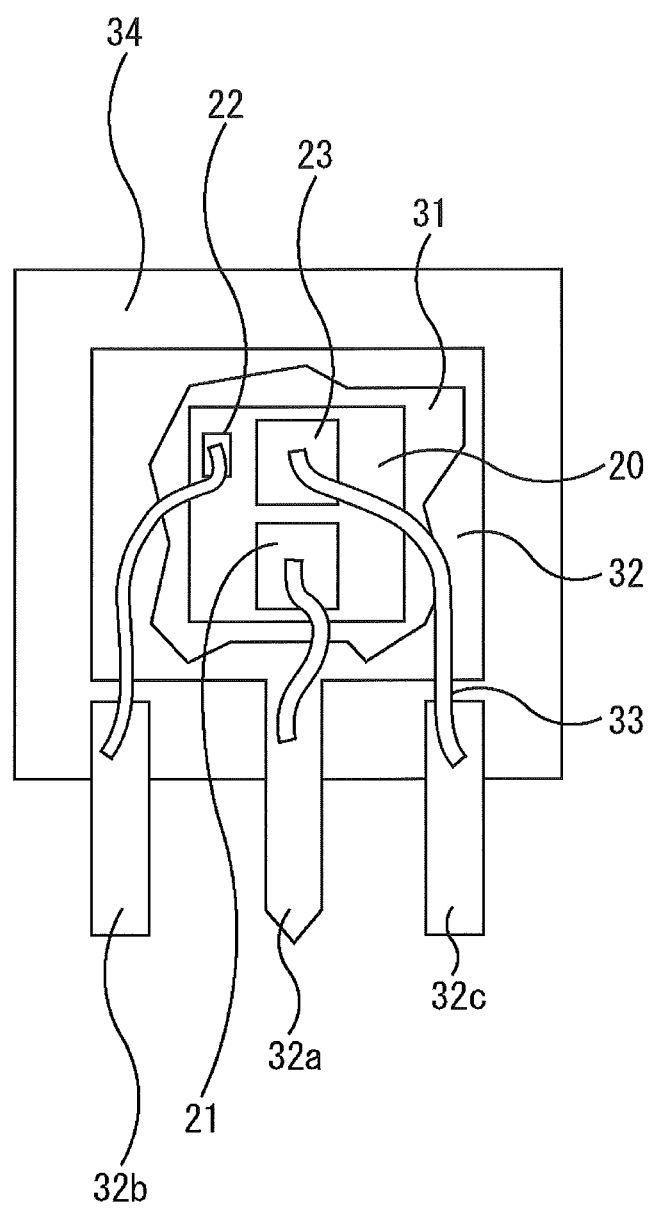
FIG. 13 is a schematic plan view illustrating a discrete package.

FIG. 13 is a schematic plan view illustrating a discrete package.

In order to fabricate a discrete package, first, the HEMT chip 20 is fixed to a lead frame 32 using a die attach agent 31 such as solder. A drain lead 32a is integrally formed with the lead frame 32, and a gate lead 32b and a source lead 32c are arranged separately from the lead frame 32.

Subsequently, the drain pad 21 and the drain lead 32a, the gate pad 22 and the gate lead 32b, and the source pad 23 and the source lead 32c are electrically connected by bonding using an Al wire 33. Thereafter, using the mold resin 34, the HEMT chip 20 is resin-sealed by a transfer molding method, and the lead frame 32 is cut off. Thus, a discrete package is formed.

Fourth Embodiment

Figure 14:
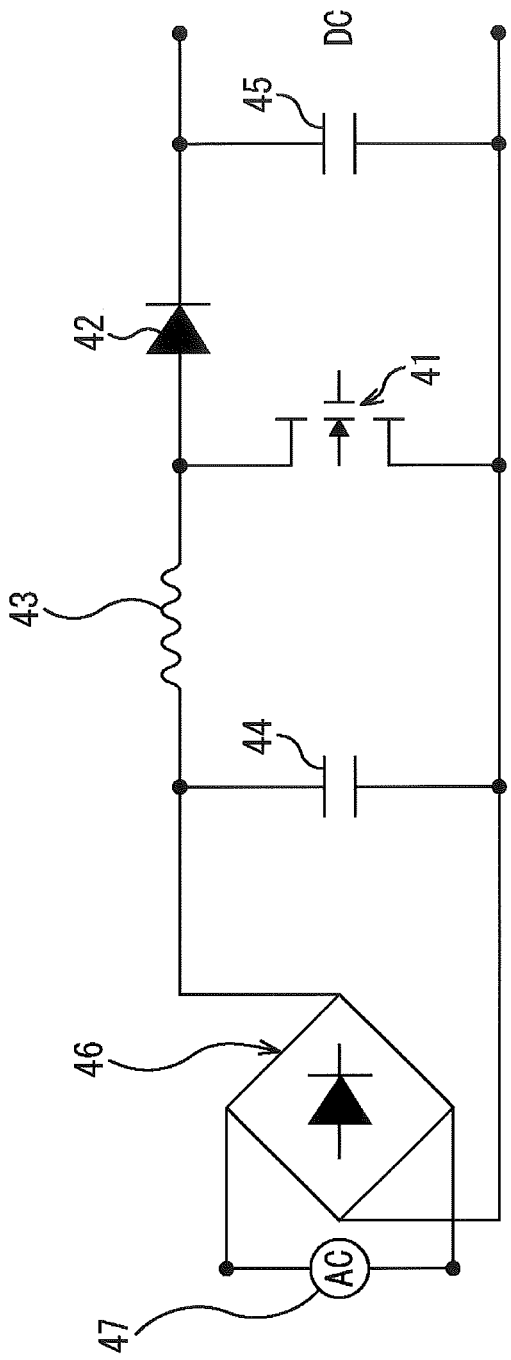
FIG. 14 is a connection diagram illustrating a schematic configuration of a PFC circuit according to a fourth embodiment.

In a fourth embodiment, a PFC (Power Factor Correction) circuit including one type of InAlGaN-HEMT selected from the first to third embodiments is disclosed. FIG. 14 is a connection diagram illustrating a schematic configuration of a PFC circuit according to the fourth embodiment.

The PFC circuit 40 includes a switch element (transistor) 41, a diode 42, a choke coil 43, capacitors 44 and 45, a diode bridge 46, and an alternating current power supply (AC) 47. One type of InAlGaN-HEMT selected from the first to third embodiments is applied to the switch element 41.

In the PFC circuit 40, a drain electrode of the switch element 41, an anode terminal of the diode 42, and one terminal of the choke coil 43 are connected. A source electrode of the switch element 41 is connected to one terminal of the capacitor 44 and one terminal of the capacitor 45. The other terminal of the capacitor 44 is connected to the other terminal of the choke coil 43. The other terminal of the capacitor 45 is connected to a cathode terminal of the diode 42. The AC 47 is connected between both terminals of the capacitor 44 via the diode bridge 46. A DC power supply (DC) is connected between both terminals of the capacitor 45.

In the fourth embodiment, an InAlGaN-HEMT is provided with a spacer layer 2c of AlGaN and a barrier layer 2d of InAlGaN that are formed by appropriately adjusting an Al composition and an In composition, such that the InAlGaN-HEMT capable of reducing gate leakage current while reducing sheet resistance is applied to the PFC circuit 40. As a result, a highly reliable PFC circuit 40 is provided.

Fifth Embodiment

Figure 15:
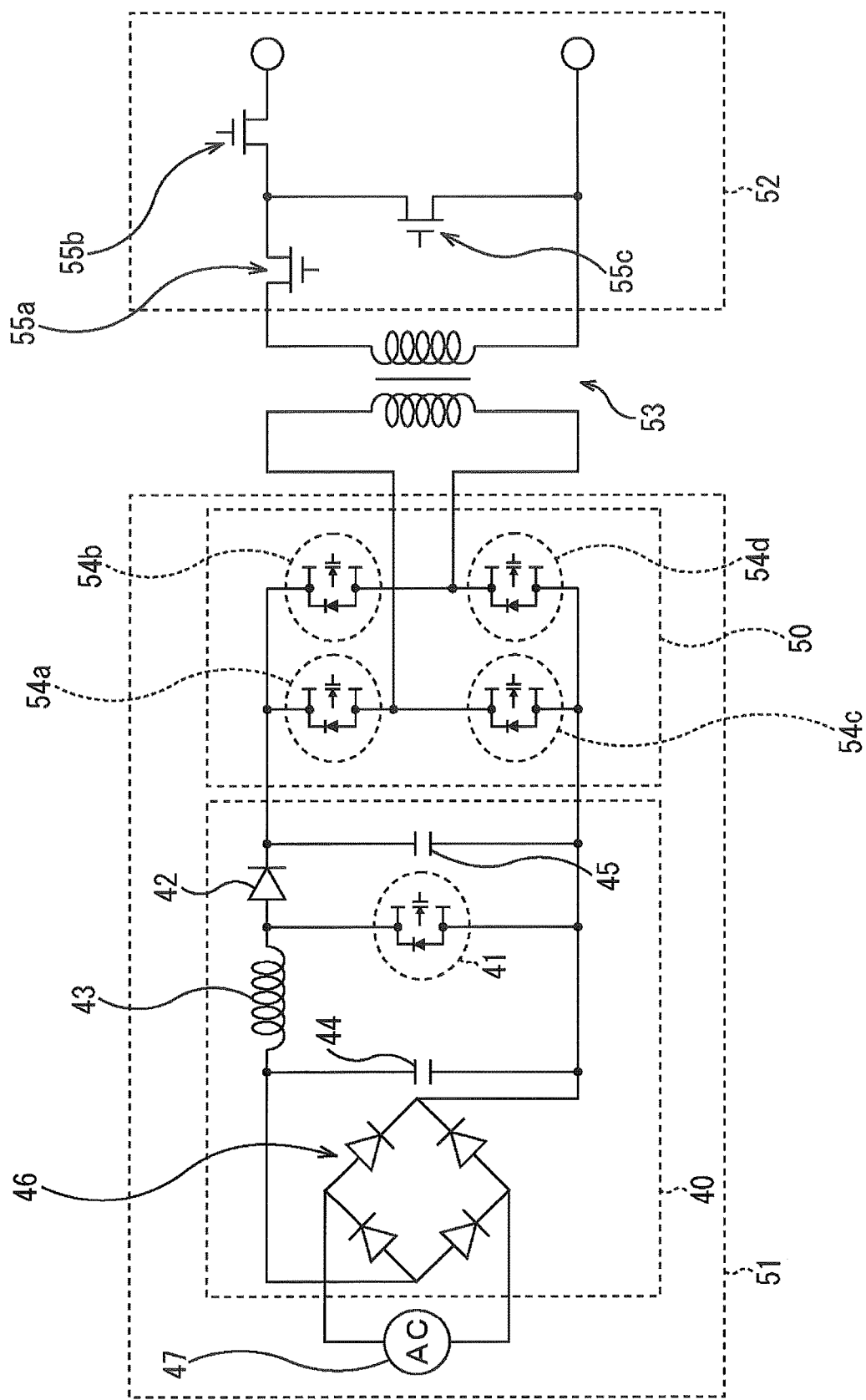
FIG. 15 is a connection diagram illustrating a schematic configuration of a power supply device according to a fifth embodiment.

In a fifth embodiment, a power supply including one type of InAlGaN-HEMT selected from the first to third embodiments is disclosed. FIG. 15 is a connection diagram illustrating a schematic configuration of a power supply device according to the fifth embodiment.

The power supply device according to the fifth embodiment is configured to include a high voltage primary circuit 51, a low voltage secondary circuit 52, and a transformer 53 disposed between the primary circuit 51 and the secondary circuit 52. The primary circuit 51 has the PFC circuit 40 according to the fourth embodiment and an inverter circuit, for example, a full bridge inverter circuit 50, connected to both terminals of the capacitor 45 of the PFC circuit 40. The full bridge inverter circuit 50 includes multiple (four in this case) switch elements 54a, 54b, 54c, and 54d. The secondary circuit 52 includes multiple (three in this case) switch elements 55a, 55b, and 55c.

In the fifth embodiment, as with the switch element 41 of the PFC circuit 40 constituting the primary circuit 51, the switch elements 54a, 54b, 54c, and 54d of the full bridge inverter circuit 50 are one type of InAlGaN-HEMT selected from the first to third embodiments. In contrast, the switch elements 55a, 55b, and 55c of the secondary circuit 52 are ordinary silicon-based MIS-FETs.

In the fifth embodiment, an InAlGaN-HEMT is provided with a spacer layer 2c of AlGaN and a barrier layer 2d of InAlGaN that are formed by appropriately adjusting an Al composition and an In composition, such that the InAlGaN-HEMT capable of reducing gate leakage current while reducing sheet resistance is applied to the primary circuit 51 acting as a high voltage circuit. As a result, a highly reliable and powerful power supply device is provided.

Sixth Embodiment

Figure 16:
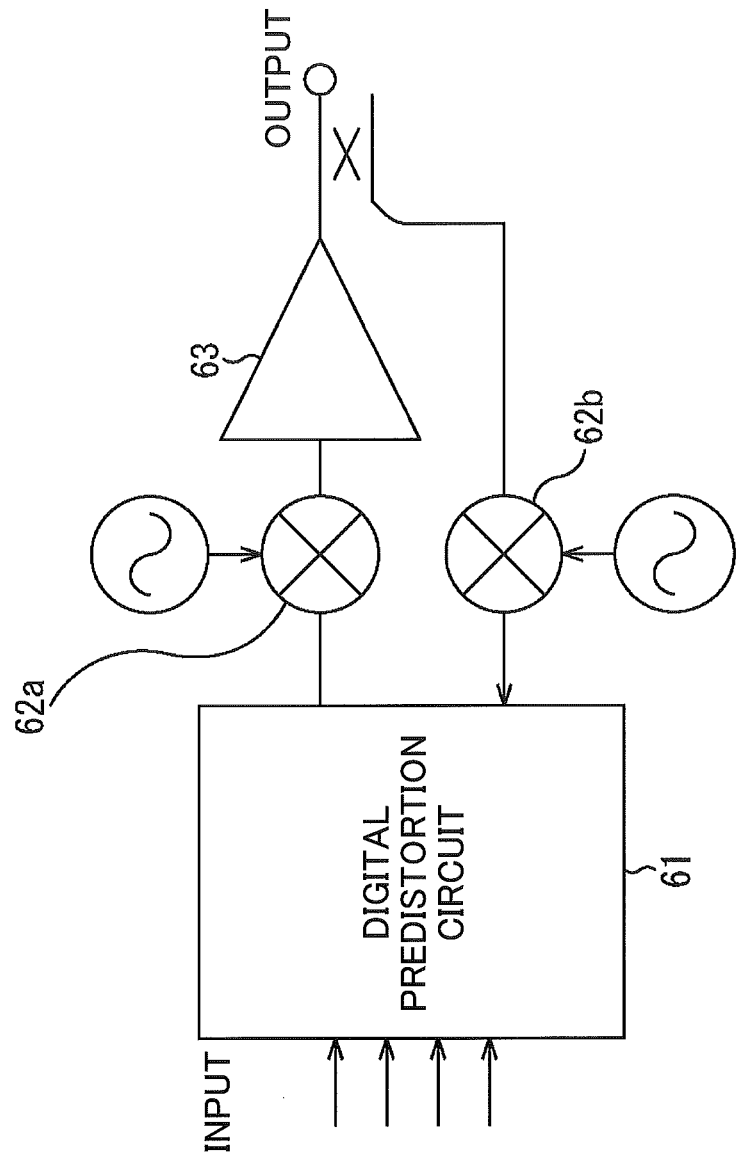
FIG. 16 is a connection diagram illustrating a schematic configuration of a high-frequency amplifier according to a sixth embodiment.

In a sixth embodiment, a high-frequency amplifier including one type of InAlGaN-HEMT selected from the first to third embodiments is disclosed. FIG. 16 is a connection diagram illustrating a schematic configuration of a high-frequency amplifier according to the sixth embodiment.

The high-frequency amplifier according to the present embodiment includes a digital predistortion circuit 61, mixers 62a and 62b, and a power amplifier 63. The digital predistortion circuit 61 is configured to compensate for nonlinear distortion of an input signal. The mixer 62a mixes an input signal whose nonlinear distortion is compensated with an AC signal. The power amplifier 63 is configured to amplify the input signal mixed with the AC signal and to include one type of InAlGaN-HEMT selected from the first to third embodiments. In FIG. 16, for example, by switching the switch element, an output signal may be mixed with the AC signal by the mixer 62b and sent to the digital predistortion circuit 61.

In the sixth embodiment, an InAlGaN-HEMT is provided with a spacer layer 2c of AlGaN and a barrier layer 2d of InAlGaN that are formed by appropriately adjusting an Al composition and an In composition, such that the InAlGaN-HEMT capable of reducing gate leakage current while reducing sheet resistance is applied to a high-frequency amplifier. As a result, a highly reliable high-frequency amplifier with high withstand voltage is provided.

According to an aspect of an embodiment, a power supply device includes
a transformer; and
a high voltage circuit and a low voltage circuit with the transformer interposed therebetween,
wherein the high voltage circuit includes a transistor, and wherein the transistor includes
a channel layer configured to generate carriers,
a spacer layer of $Al_{y1}Ga_{1-y1}N$ (0.20<y1≤0.70) formed on the channel layer, and
a barrier layer of $In_{x2}Al_{y2}Ga_{1-x2-y2}N$ (0≤x2≤0.15 and 0.20≤y2<0.70) formed on the spacer layer, wherein y1 and y2 satisfy a relationship of y1>y2.

In the power supply device, the high-voltage circuit includes a PFC circuit, and the transistor is a first switch element provided in the PFC circuit.

In the power supply device, the high-voltage circuit further includes an inverter circuit connected to the PFC circuit, and the transistor is a second switch element provided in the inverter circuit.

According to an aspect of the embodiments, a compound semiconductor device capable of reducing a leakage current while reducing sheet resistance is provided.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising:
    a channel layer configured to generate carriers;
    a spacer layer of $Al_{y1}Ga_{1-y1}N$ (0.20<y1≤0.70) formed on the channel layer; and
    a barrier layer of $In_{x2}Al_{y2}Ga_{1-x2-y2}N$ (0≤x2≤0.15 and 0.20≤y2<0.70) formed on the spacer layer,
    wherein y1 and y2 satisfy a relationship of y1>y2.

2. The compound semiconductor device as claimed in claim 1, wherein the spacer layer satisfies 0.22≤y1≤0.60.

3. The compound semiconductor device as claimed in claim 1, wherein the barrier layer satisfies x2≥0.005 and 0.22≤y2≤0.60.

4. The compound semiconductor device as claimed in claim 1, wherein the channel layer has a carrier concentration of $0.50×10^{13}$ cm$^{-3}$ or more and $1.50×10^{13}$ cm$^{-3}$ or less.

5. The compound semiconductor device as claimed in claim 1, wherein the channel layer has a carrier mobility of 1900 cm$^2$V$^{-1}$ s$^{-1}$ or more.

6. The compound semiconductor device as claimed in claim 1, wherein a total thickness of the spacer layer and the barrier layer is 4 nm or more and 10 nm or less.

7. The compound semiconductor device as claimed in claim 1, further comprising:
    a cap layer of GaN formed on the barrier layer.

8. The compound semiconductor device as claimed in claim 7, wherein a total thickness of the spacer layer, the barrier layer, and the cap layer is 4 nm or more and 10 nm or less.

9. The compound semiconductor device as claimed in claim 1, further comprising:
    a contact layer of a compound semiconductor; and
    an electrode in ohmic contact with the contact layer.

10. A method for fabricating a compound semiconductor device, the method comprising:
    forming a channel layer configured to generate carriers;
    forming a spacer layer of $Al_{y1}Ga_{1-y1}N$ (0.20<y1≤0.70) on the channel layer; and
    forming a barrier layer of $In_{x2}Al_{y2}Ga_{1-x2-y2}N$ (0≤x2≤0.15 and 0.20≤y2<0.70) on the spacer layer,
    wherein y1 and y2 satisfy a relationship of y1>y2.

11. The method as claimed in claim 10, wherein the spacer layer satisfies 0.22≤y1≤0.60.

12. The method as claimed in claim 10, wherein the barrier layer satisfies x2≥0.005 and 0.22≤y2≤0.60.

13. The method as claimed in claim 10, wherein the channel layer has a carrier concentration of $0.50×10^{13}$ cm$^{-3}$ or more and $1.50×10^{13}$ cm$^{-3}$ or less.

14. The method as claimed in claim 10, wherein the channel layer has a carrier mobility of 1900 cm$^2$V$^{-1}$ s$^{-1}$ or more.

15. The method as claimed in claim 10, wherein a total thickness of the spacer layer and the barrier layer is 4 nm or more and 10 nm or less.

16. The method as claimed in claim 10, further comprising:
    forming a cap layer of GaN on the barrier layer.

17. The method as claimed in claim 16, wherein a total thickness of the spacer layer, the barrier layer, and the cap layer is 4 nm or more and 10 nm or less.

18. The method as claimed in claim 10, further comprising:
   forming a contact layer of a compound semiconductor; and
   forming an electrode in ohmic contact with the contact layer.

19. A high-frequency amplifier amplifying an input high-frequency voltage, the high-frequency amplifier comprising:
   a transistor,
   wherein the transistor includes
      a channel layer configured to generate carriers,
      a spacer layer of $Al_{y1}Ga_{1-y1}N$ ($0.20<y1\leq0.70$) formed on the channel layer, and
      a barrier layer of $In_{x2}Al_{y2}Ga_{1-x2-y2}N$ ($0\leq x2\leq0.15$ and $0.20\leq y2<0.70$) formed on the spacer layer, wherein y1 and y2 satisfy a relationship of y1>y2.

* * * * *